(12) United States Patent
Barnett

(10) Patent No.: US 7,812,649 B2
(45) Date of Patent: Oct. 12, 2010

(54) LOW POWER, POWER ON RESET CIRCUIT WITH ACCURATE SUPPLY VOLTAGE DETECTION

(75) Inventor: Raymond E. Barnett, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 113 days.

(21) Appl. No.: 11/015,632

(22) Filed: Dec. 17, 2004

(65) Prior Publication Data

US 2006/0132201 A1 Jun. 22, 2006

(51) Int. Cl.
*H03L 7/00* (2006.01)
(52) U.S. Cl. .................... 327/143; 327/77; 327/198
(58) Field of Classification Search .......... 327/77, 327/142, 143, 198
See application file for complete search history.

(56) References Cited

U.S. PATENT DOCUMENTS

| | | | | |
|---|---|---|---|---|
| 4,939,442 A | * | 7/1990 | Carvajal et al. | 323/281 |
| 5,530,395 A | * | 6/1996 | Ting | 327/543 |
| 5,541,538 A | * | 7/1996 | Bacrania et al. | 327/77 |
| 6,160,424 A | * | 12/2000 | Migliavacca | 327/65 |
| 6,163,190 A | * | 12/2000 | Takai et al. | 327/205 |
| 7,142,023 B2 | * | 11/2006 | Hiramatsu et al. | 327/89 |

OTHER PUBLICATIONS

Chien-In Henry Chen, Anup Kumar, Bicmos Logic Circuits, Dec. 27, 1999, John Wiley & Sons, Inc., Wiley Encyclopedia of Electrical and Electronics Engineering, Section 1 (Bicmos Inverter) Paragraph 1.*
John D. Cressler, Bipolar Transistors, Dec. 27,1999, John Wiley & Sons, Inc., Wiley Encyclopedia of Electrical and Electronics Engineering, Section 5 (Future Directions) Paragraph 1.*

* cited by examiner

*Primary Examiner*—Lincoln Donovan
*Assistant Examiner*—William Hernandez
(74) *Attorney, Agent, or Firm*—John J. Patti; Wade J. Brady, III; Frederick J. Telecky, Jr.

(57) ABSTRACT

The power on reset circuit includes: a comparator; a resistor string having a first end coupled to a first supply node of the comparator, a first tap point node coupled to a first input of the comparator, and a second end coupled to a second input of the comparator; and a diode connected transistor device coupled between the second end of the resistor string and a second supply node of the comparator.

7 Claims, 1 Drawing Sheet

LOW POWER, POWER ON RESET CIRCUIT WITH ACCURATE SUPPLY VOLTAGE DETECTION

FIELD OF THE INVENTION

The present invention relates to electronic circuitry and, in particular, to a low power, power on reset circuit with accurate supply voltage detection.

BACKGROUND OF THE INVENTION

Many prior art power on reset circuits exist of which a majority are meant for digital applications for which the reset needs to release once the power supply has reached a level safe for the digital circuitry to store voltages for a known startup condition. Thus the reset level can effectively track the threshold voltages (VT's) of the MOS devices and can vary with the large VT process variations (3:1 in some cases over temp and process). If analog circuitry exists there may be a need for a more accurate reset so that reliable operation of the analog circuits is achieved. This is often a more complicated function than VT variation and may require an accurate band-gap based power on reset, which is stable over process and temperature variations.

FIGS. 1 and 2 show examples of prior art power on reset circuits.

The circuit of FIG. 1 can be designed for low power applications with a current consumption of about 10 nA with a total resistance of about 80 Mohms. The circuit functions well for digital applications and has a well-known VT dependence for the power supply threshold. The trip point can vary from 0.8V down to 0.2V typically. If the circuit were used for analog applications as simple as an internal clock oscillator, the oscillator could malfunction corrupting the on chip clock and subsequently corrupting the digital data that the clock system drives. This is especially problematic if the circuit undergoes a sudden power loss.

The circuit of FIG. 2 is an example of an accurate band-gap comparator. This solution combines the function of a band-gap reference with the supply tap comparator. Resistors R2 and R3 are the supply sampling string resistors and the supply voltage VDD is divided down by R3/(R3+R2). This divided down supply goes into the band-gap comparator which switches state when the input (bases of transistors Q0 and Q1) are equal to the band gap voltage. Transistor Q1 is run at a lower current density than transistor Q0, and resistor R0 completes the well known proportional-to-absolute-temperature (PTAT) loop. Resistor R1 thus has a PTAT voltage across it (at the trip point) and transistor Q0's base-to-emitter voltage (vbe) completes the band gap voltage at the bases of transistors Q0 and Q1. The resistors must be sized properly for a given technology to make the comparator stable over process and temperature.

One drawback to this design is the required voltage headroom for operation is greater than the band-gap voltage (~1.2V). The other drawback is the need for several large resistors since low current consumption is desired. The total resistance can total 100's of Mohms for current consumption of 10's of nA. This creates a significant die size penalty.

SUMMARY OF THE INVENTION

A power on reset circuit includes: a comparator; a resistor string having a first end coupled to a first supply node of the comparator, a first tap point node coupled to a first input of the comparator, and a second end coupled to a second input of the comparator; and a diode connected transistor device coupled between the second end of the resistor string and a second supply node of the comparator.

DETAILED DESCRIPTION OF PREFERRED EMBODIMENTS

Figure 3:
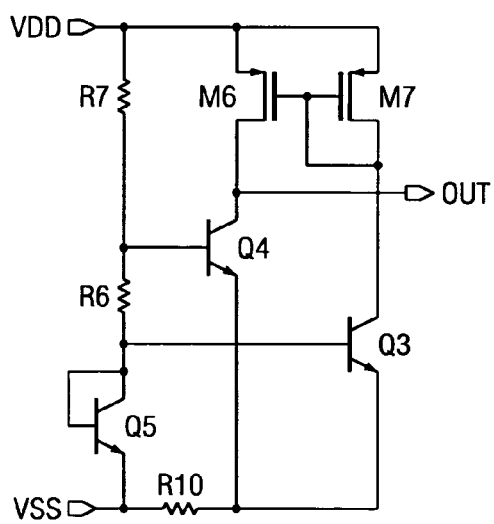
FIG. 3. is a circuit diagram of a band gap comparator power on reset circuit, according to the present invention.

FIG. 3 shows a simple implementation of a band gap comparator technique that minimizes the total resistance needed and can operate at 1.2V and lower (with some accuracy loss), according to the present invention. The circuit of FIG. 3 includes MOS transistors M6 and M7; bipolar transistors Q3, Q4, and Q5; resistors R6, R7, and R10; supply voltages VDD and VSS; and output node OUT. Transistors M6, M7, Q3, and Q4 form a band gap comparator.

Transistor Q3 is designed to run at a lower current density at the trip point than transistor Q4. Resistor R6 is the PTAT loop resistance and resistor R7 sets the current consumption. The comparator will trip when supply voltage VDD is approximately 1.2V if the resistors are chosen properly. If supply voltage VDD is 1.2V, the current in the resistor string R6 and R7 is PTAT by definition since transistor Q5's vbe plus the drop across resistors R6 and R7 equals the band-gap voltage. If transistor Q3 is eight times the emitter area of transistor Q4 then the well known 54 mV difference (room temp) exists between the bases of transistors Q3 and Q4 when the collector currents are equal (the trip point). Resistors R7 and R6 are chosen such that this condition occurs. The comparator is stable over process and temp when designed for a trip voltage of a band-gap voltage. The circuit can be designed for lower trip voltages with more of a tolerance in variation over supply and temp. The circuit can be designed for trip points at 800 mV plus or minus 10% over temperature and process variations, for example. Resistor R10 can be eliminated and is only used to reduce current consumption in the comparator portion of the circuit. Resistor R10 is effective with 10's of Kohms. The total resistance of 65 Mohms (resistor R7 plus resistor R6) can be used for 30 nA typical current consumption.

Figure 1:
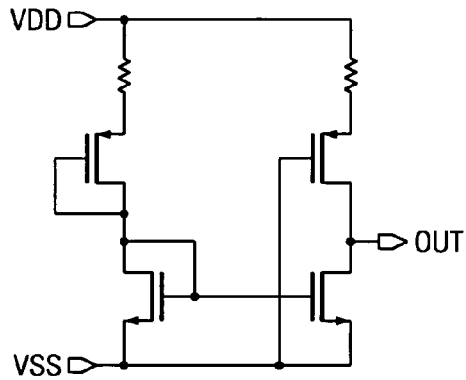
FIG. 1 is a circuit diagram of a prior art power on reset circuit.
Figure 2:
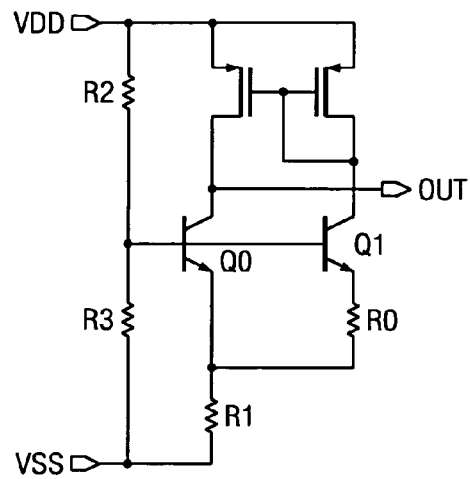
FIG. 2. is a circuit diagram of a prior art power on reset circuit with a band gap comparator.

A big advantage of this circuit is the required resistance is minimized for a given current consumption. This is accomplished by dropping VDD-VBE across the resistor string R6 and R7 (instead of the full supply voltage VDD) and combining the supply voltage VDD sampling string with the PTAT function of FIG. 2.

Figure 4:
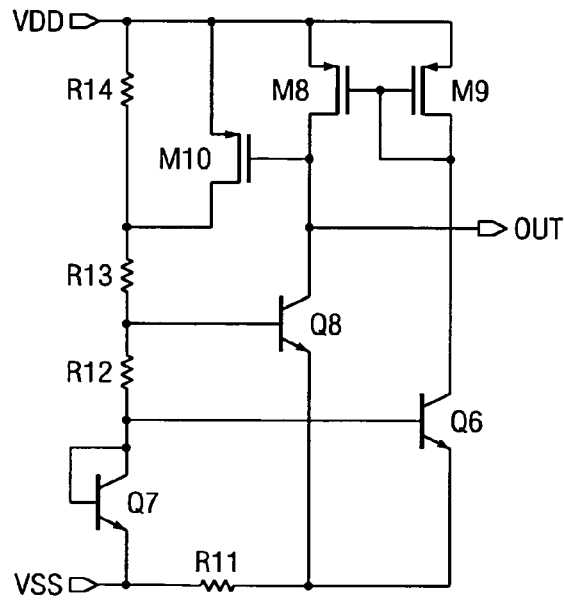
FIG. 4. is a circuit diagram of band gap comparator power on reset circuit with the addition of well defined hysteresis, according to the present invention.

The circuit of FIG. 4 is similar to the circuit of FIG. 3 with the addition of well defined hysteresis with the addition of a single PMOS transistor M10, and resistors R12, R13, and R14 instead of resistors R6 and R7.

The present invention provides power on reset with 10's of nA current consumption that has predictable/stable supply voltage detection threshold. This band-gap comparator is optimized for low power and reduced die size.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus comprising:
   a first voltage rail;
   a second voltage rail;
   a first bipolar transistor that is coupled to the second voltage rail at its emitter, wherein the first bipolar transistor is diode-connected;
   a plurality of resistor that are coupled in series with one another between the first voltage rail and the collector of the first bipolar transistor, wherein the sum of the base-emitter voltage of the first bipolar transistor and the voltage drop across the plurality of resistor is equal to a bandgap voltage;
   a current mirror that is coupled to the first voltage rail;
   a second bipolar transistor that is coupled to the current mirror at its collector and to the second voltage rail at its emitter, wherein the second bipolar transistor has a first emitter area; and
   a third bipolar transistor that is coupled to the current mirror at its collector and to the second voltage rail at its emitter, wherein the third bipolar transistor has a second emitter area, wherein the bases of the second and third bipolar transistors are coupled across at least one of the resistors of the plurality of resistor, and wherein the first emitter area, the second emitter area, and the resistances of the plurality of resistors are dimensioned so as to have generally equal collector currents for the second and third bipolar transistors at room temperature.

2. The apparatus of claim 1, wherein the current mirror further comprises:
   a first MOS transistor that is coupled to the first voltage rail at its source and to the collector of the second bipolar transistor at its drain; and
   a second MOS transistor that is coupled to the first voltage rail at its source, to the collector of the third bipolar transistor at its drain, and to the gate of the first MOS transistor at its gate and drain.

3. The apparatus of claim 2, wherein the second emitter area is eight times larger than the first emitter area.

4. The apparatus of claim 3, wherein the apparatus further comprises a resistor that is coupled between each of the emitters of the second and third bipolar transistors and the second voltage rail.

5. The apparatus of claim 4, wherein the first, second, and third bipolar transistors further comprise first, second, and third NPN transistors, respectively.

6. The apparatus of claim 5, wherein the first and second MOS transistors further comprise first and second PMOS transistors, respectively.

7. The apparatus of claim 6, wherein the apparatus further comprises a third PMOS transistor that is coupled to the first voltage rail at its source, to the drain of the first PMOS transistor at its gate, and to at least one of the plurality of resistors at its drain.

* * * * *